United States Patent [19]
Keyser et al.

[11] Patent Number: 6,075,317
[45] Date of Patent: Jun. 13, 2000

[54] ELECTROLUMINESCENT DEVICE HAVING INCREASED BRIGHTNESS AND RESOLUTION AND METHOD OF FABRICATION

[75] Inventors: Thomas R. Keyser, Ellicott City; Gerald D. Becker, Eidersburg, both of Md.

[73] Assignee: AlliedSignal Inc., Morristown, N.J.

[21] Appl. No.: 09/126,288

[22] Filed: Jul. 30, 1998

[51] Int. Cl.[7] .............................. H01J 1/62; H01J 63/04
[52] U.S. Cl. ..................... 313/505; 313/113; 313/117; 313/506; 313/509; 313/517
[58] Field of Search ................... 313/505, 506, 313/509, 517, 518, 113, 114, 117

[56] References Cited

U.S. PATENT DOCUMENTS

| | | | |
|---|---|---|---|
| 3,900,758 | 8/1975 | Andoh et al. | 313/485 |
| 5,273,774 | 12/1993 | Karam et al. | 427/64 |
| 5,463,279 | 10/1995 | Khormaei | 315/169.3 |
| 5,491,378 | 2/1996 | Lee et al. | 313/506 |
| 5,910,706 | 6/1999 | Stevens et al. | 313/498 |

OTHER PUBLICATIONS

Khormaei et al., High–Resolution Active–Matrix Electroluminescent Display, SID 94 Digest, ISSN0097–0966X/94/2501–0137, pp. 137–139.

Khormaei et al., A 1280 x 1024 Active–Matrix EL Display, SID 95 Digest, ISSN0097–0966X/95/2601–0891, pp. 891–893.

Arbuthnot et al., A 2000–lpi Active–Matrix EL Display, SID 96 Digest, ISSN0097–0966X/96/2701–0374, pp. 374–377.

*Primary Examiner*—Vip Patel
*Assistant Examiner*—Michael J. Smith
*Attorney, Agent, or Firm*—Loria B. Yeadon

[57] ABSTRACT

An electroluminescent device in accordance with the present invention includes a plurality of pixel electrodes disposed on a dielectric layer and coupled to control circuitry. An electroluminescent stack and a transparent electrode are included wherein the electroluminescent stack is disposed between the transparent electrode and the plurality of pixel electrodes. A plurality of guides are disposed between each of the pixel electrodes for guiding light from the electroluminescent stack when the pixel electrodes are activated by the control circuitry and reducing internal reflections of light within the electroluminescent stack. Another device and method include a dielectric layer disposed between the pixel electrodes for absorbing light and reducing a threshold voltage of the stack. A method for fabricating an electroluminescent device includes the steps of providing a substrate having an integrated control circuit formed therein, forming an interlevel dielectric layer on the substrate, forming pixel electrodes on the interlevel dielectric layer, the pixel electrodes being coupled to the control circuit, forming an electroluminescent stack on the pixel electrodes, forming a transparent electrode over the electroluminescent stack and forming a plurality of guides disposed between the pixel electrodes for guiding light from the electroluminescent stack when the pixel electrodes are activated by the control circuit and reducing internal reflections of light within the electroluminescent stack.

31 Claims, 13 Drawing Sheets ns to the
commonly assigned application entitled "INTERCON-
NECTS AND ELECTRODES FOR HIGH LUMINANCE
EMISSIVE DISPLAYS", filed concurrently herewith and
incorporated herein by reference.

ELECTROLUMINESCENT DEVICE HAVING INCREASED BRIGHTNESS AND RESOLUTION AND METHOD OF FABRICATION

RELATED APPLICATION DATA

This application Ser. No. 09/128,019, is related to the commonly assigned application entitled "INTERCONNECTS AND ELECTRODES FOR HIGH LUMINANCE EMISSIVE DISPLAYS", filed concurrently herewith and incorporated herein by reference.

BACKGROUND OF THE INVENTION

1. Field of the Invention

The present invention relates to electroluminescent structures and, more particularly, to an electroluminescent device and method having increased brightness and resolution for electroluminescent displays.

2. Description of the Related Art

Electroluminescent (EL) displays produce light when an alternating current (AC) voltage is applied across a phosphor film sandwiched between a pair of electrodes. If an organic material is used, a similar structure is used however excitation of the organic material is performed in a different manner, for example using DC current. Referring to FIG. 1, electroluminescent light originates from metal activator atoms that are introduced into a phosphor film 12 and excited by energetic electrons as they move across the semi-conducting phosphor film 12. Since the phosphors employed have large band gaps, visible radiation produced (indicated by arrows) passes through film 12 without absorption and out of the stack through a transparent electrode 14.

The typical EL film stack contains two dielectric layers 16 and 18, one at each electrode interface, i.e. one for transparent electrode 14 and one for electrodes 20. These dielectric layers limit the current through the structure and prevent a catastrophic breakdown should a phosphor imperfection produce a conductive path through film 12. Dielectric layers 16 and 18 also store charge, increase the internal electric field and reduce the effective turn-on voltage of the phosphor. Thin 500 to 1000 Å films with high dielectric constants are often used to enhance the effect and increase the luminous efficiency of EL displays.

Compact high-resolution displays have been produced with on-chip scanning and pixel control circuitry. In these "active matrix" displays, the necessary dielectric, phosphor and transparent electrode layers are deposited and defined as a single rectangle over the entire pixel array. Referring again to FIG. 1, individual pixel electrodes 20 are controlled by switching a transistor 22 which blocks the AC phosphor excitation voltage 24 when "off" and allows passage current through the phosphor when "on". Pixel electrodes 20 are positioned directly over the controlling transistors, to maximize resolution.

While this architecture addresses the information content and size requirements of small displays, the structure limits the brightness and resolution achievable. Pixel electrodes translate the underlying topology of the active matrix array and present an irregular surface that does not efficiently reflect phosphor radiation toward a viewer. Light emitted from one pixel can migrate from the electrode to neighboring pixels through lateral emission and internal reflection in the phosphor film stack to degrade resolution and color spectral purity as shown in FIG. 1. Pixel electrode structures that maximize the phosphor emission and transmission efficiency and minimize lateral light diffusion are needed to satisfy the requirements for high brightness, color and high-resolution display products.

SUMMARY OF THE INVENTION

An electroluminescent device in accordance with the present invention includes a plurality of pixel electrodes disposed on a dielectric layer and coupled to control circuitry. An electroluminescent stack and a transparent electrode are included wherein the electroluminescent stack is disposed between the transparent electrode and the plurality of pixel electrodes. A plurality of guides are disposed between each of the pixel electrodes for guiding light from the electroluminescent stack when the pixel electrodes are activated by the control circuitry and reducing internal reflections of light within the electroluminescent stack.

In alternate embodiments of the electroluminescent device, the guides may include a reflective material on surfaces of the guide to reflect light in a desired direction and to reduce absorption of the electroluminescent light. The reflective material may include aluminum, chromium or other suitable materials. The guides may include an antireflection material on lower surfaces of the guide to reduce internal reflections in the electroluminescent stack due to the guides. The antireflection material may include titanium, silicon or other suitable materials. The electroluminescent stack may include a first dielectric layer disposed between the pixel electrodes and an electroluminescent layer and a second dielectric layer disposed between the transparent electrode and the electroluminescent layer. The electroluminescent layer may include separated portions, each portion being associated with an electrode of the pixel electrodes, the separated portions being isolated therebetween by the second dielectric layer and the transparent electrode to reduce lateral light diffusion between the separated portions. The electroluminescent layer preferably includes zinc sulfide. A dielectric material may be disposed between pixel electrodes wherein the dielectric material absorbs light directed between the pixel electrodes. The guides may be disposed on the transparent electrode. The guides may be disposed between the electroluminescent stack and the transparent electrode. The pixel electrodes may include an electrically floating conductive ring spaced apart from and laterally surrounding each pixel electrode for reducing light emissions and an electric field about the pixel electrodes.

Another electroluminescent display includes a substrate having an integrated control circuit formed thereon. An interlevel dielectric layer is disposed on the substrate. A plurality of pixel electrodes are disposed on the interlevel dielectric layer and coupled to the control circuit by vias formed in the interlevel dielectric layer. An electroluminescent stack and a transparent electrode are included wherein the electroluminescent stack is disposed between the transparent electrode and the pixel electrodes. A dielectric layer is disposed between pixel electrodes and has a same thickness as the pixel electrodes wherein the dielectric layer reduces an electric field and light emission from between pixel electrodes.

In alternate embodiments, a plurality of guides may be disposed between the pixel electrodes for guiding light from the electroluminescent stack when the pixel electrodes are activated by the control circuit and reducing internal reflections of light within the electroluminescent stack to provide improved brightness and resolution of the display. The guides may include a reflective material on surfaces of the guide to reflect light in a desired direction and to reduce absorption of the electroluminescent light. The reflective material may include aluminum, chromium or other suitable materials. The guides may include an antireflection material on lower surfaces of the guide to reduce internal reflections in the electroluminescent stack due to the guides. The antireflection material includes titanium, silicon or other suitable materials. The electroluminescent stack, preferably, includes a first dielectric layer disposed between the pixel electrodes and an electroluminescent layer and a second dielectric layer disposed between the transparent electrode and the electroluminescent layer. The dielectric layer between the pixel electrodes preferably has a lower dielectric constant than the first and second dielectric layers of the electroluminescent stack. The electroluminescent layer may include separated portions, each portion being associated with an electrode of the pixel electrodes, the separated portions being isolated therebetween by the second dielectric layer and the transparent electrode to reduce lateral light diffusion between the separated portions. The electroluminescent stack may include an organic material sandwiched between a hole transport layer and an electron transport layer. The electroluminescent layer may include separated portions, each portion being associated with an electrode of the pixel electrodes, the separated portions being isolated therebetween by the second dielectric layer and the transparent electrode to reduce lateral light diffusion between the separated portions. The electroluminescent layer preferably includes zinc sulfide. The dielectric material between pixel electrodes may absorb light at a wavelength emitted from the electroluminescent layer and directed between the pixel electrodes. The guides may be disposed on the transparent electrode or between the electroluminescent stack and the transparent electrode. The pixel electrodes may include an electrically floating conductive ring spaced apart from and laterally surrounding each pixel electrode for reducing light emissions and an electric field about the pixel electrodes.

A method for fabricating an electroluminescent device includes the steps of providing a substrate having an integrated control circuit formed therein, forming an interlevel dielectric layer on the substrate, forming pixel electrodes on the interlevel dielectric layer, the pixel electrodes being coupled to the control circuit, forming an electroluminescent stack on the pixel electrodes, forming a transparent electrode over the electroluminescent stack and forming a plurality of guides disposed between the pixel electrodes for guiding light from the electroluminescent stack when the pixel electrodes are activated by the control circuit and reducing internal reflections of light within the electroluminescent stack.

In other methods, the step of planarizing the interlevel dielectric layer to provide a planar surface for forming the pixel electrodes may be included. The step of forming vias through the interlevel dielectric layer by depositing a conductive layer on the interlevel dielectric layer, the vias for coupling the pixel electrodes to the control circuit may also be included. The step of forming the pixel electrodes may include the step of patterning a conductive layer deposited on the interlevel dielectric layer to form pixel electrodes. The step of forming an electroluminescent stack may include the steps of forming a first dielectric layer on the pixel electrodes, forming an electroluminescent layer on the first dielectric layer and forming a second dielectric layer on the electroluminescent layer. The step of forming the plurality of guides disposed between the pixel electrodes may include the step of forming the guides on the transparent electrode. The step of forming the plurality of guides disposed between the pixel electrodes may include the step of forming the guides between the electroluminescent stack and the transparent electrode. The step of forming the plurality of guides may further include the steps of forming an anti-reflective layer and forming a reflective layer on the anti-reflective layer such that electroluminescent light produced by the electroluminescent stack has reduced internal reflections of light due to the anti-reflective layer and has increased brightness and resolution to a viewer due to the reflective layer. The step of forming pixel electrodes may include the step of providing a dielectric material about lateral surfaces of the pixel electrodes, the dielectric material for absorbing electroluminescent light produced by the electroluminescent stack to reduce internal reflections. The step of forming the pixel electrodes may also include the steps of forming pockets in the interlevel dielectric layer, depositing a conductive material in the pockets and planarizing the conductive material to form the pixel electrodes.

Another method for fabricating an electroluminescent device includes the steps of providing a substrate having an integrated control circuit formed therein and an interlevel dielectric layer formed on the substrate, depositing a first dielectric layer on the interlevel dielectric layer, forming pockets in the dielectric material, forming pixel electrodes in the pockets and electrically coupling the pixel electrodes to the control circuit, the first dielectric layer having a same thickness as the pixel electrodes, forming an electroluminescent stack on the pixel electrodes and forming a transparent electrode over the electroluminescent stack.

In still other methods, the step of forming a plurality of guides disposed between the pixel electrodes for guiding light from the electroluminescent stack when the pixel electrodes are activated by the control circuit and reducing internal reflections of light within the electroluminescent stack may be included. The step of forming the plurality of guides may include the steps of forming an anti-reflective layer and forming a reflective layer on the anti-reflective layer such that electroluminescent light produced by the electroluminescent layer has reduced internal reflections of light due to the anti-reflective layer and has increased brightness and resolution to a viewer due to the reflective layer. The step of planarizing the interlevel dielectric layer to provide a planar surface for forming the pixel electrodes may be included. The step of forming an electroluminescent stack may include the steps of forming a first dielectric layer on the pixel electrodes, forming the electroluminescent layer on the first dielectric layer and forming a second dielectric layer on the electroluminescent layer. The step of forming the plurality of guides disposed between the pixel electrodes may include the step of forming the guides on the transparent electrode. The step of forming the plurality of guides disposed between the pixel electrodes may also include the step of forming the guides between the electroluminescent stack and the transparent electrode.

The step of forming pixel electrodes may further include the step of providing a conductive material about lateral surfaces of the pixel electrodes, the conductive material being spaced apart from and electrically floating relative to the pixel electrodes, the conductive material for absorbing electroluminescent light produced by the electroluminescent layer and for reducing an electric field between pixel electrodes. The step of forming the pixel electrodes may include the steps of depositing a conductive material in the pockets and planarizing the conductive material to form the pixel electrodes. The step of forming an electroluminescent stack may include the steps of forming an electron transport layer on the pixel electrodes, forming an organic electroluminescent layer on the first dielectric layer and forming a hole transport layer on the electroluminescent layer.

These and other objects, features and advantages of the present invention will become apparent from the following detailed description o illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The present invention relates to electroluminescent structures and, more particularly, to an electroluminescent device and method having increased brightness and resolution for electroluminescent displays. An electroluminescent structure in accordance with the present invention provides an electrode array that is planar and includes a highly reflective surface that maximizes luminance of the display. Greater detail of the structure and methods of the present invention are described herein.

Figure 2:
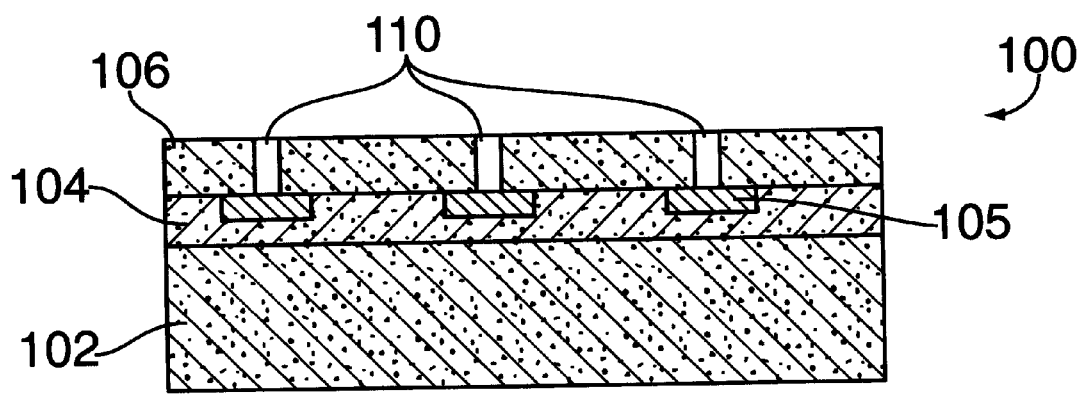
FIG. 2 is a cross-sectional view of an electroluminescent structure in accordance with the present invention showing a planarized interlevel dielectric layer.

Referring now in specific detail to the drawings where like numerals represent the same or similar elements and initially to FIG. 2, an electroluminescent (EL) structure is shown and referred to generally as structure 100. Structure 100 and a fabrication procedure are outlined herein. A substrate 102 is provided for fabricating a high efficiency EL pixel electrode structure and control circuitry. Substrate 102 is preferably silicon although other suitable materials are contemplated. Control circuitry 105 is included on layer 104 and includes controlling transistors as described above. Layer 104 may include a dielectric material such as a silicon oxide and may also include silicon for a silicon on insulator structure. An interlevel dielectric layer 106 is deposited to isolate the control circuitry from an electrode layer to be formed in subsequent steps (see FIG. 3). Dielectric layer 106 is then planarized using established chemical-mechanical polishing (CMP) or providing a sacrificial layer and etching it back to provide a planarized surface for the formation of additional layers as described hereinafter.

Holes 110 for vias are formed in dielectric layer 106 to provide for connection between electrodes to be formed and the controlling transistors of layer 104.

Figure 3:
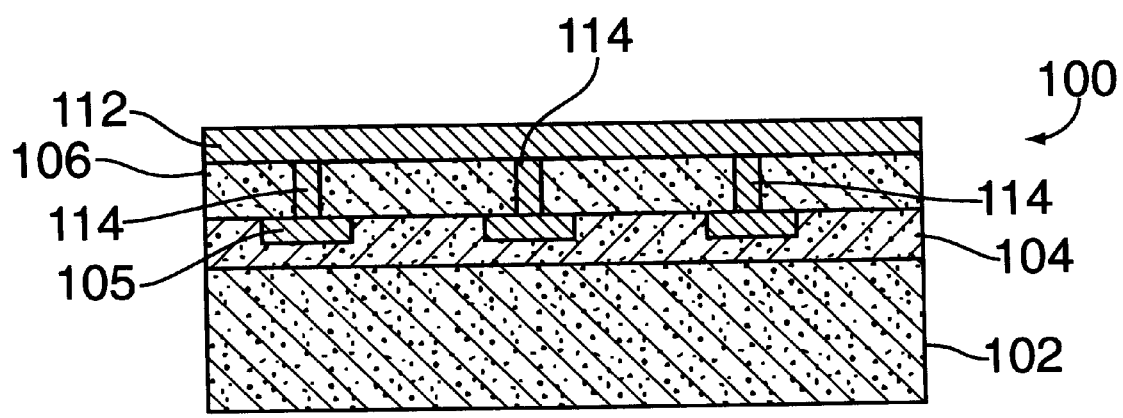
FIG. 3 is a cross-sectional view of the electroluminescent structure of FIG. 2 in accordance with the present invention showing a reflective conductive layer deposited.

Referring to FIG. 3, in one embodiment a conductive, reflective layer 112 is deposited over the surface of dielectric layer 106. Electroplating or chemical vapor deposition (CVD) methods may be used to fill holes 110 for vias and minimize the indentation over a contact area between vias 114 and electrodes to be formed from layer 112.

Figure 4:
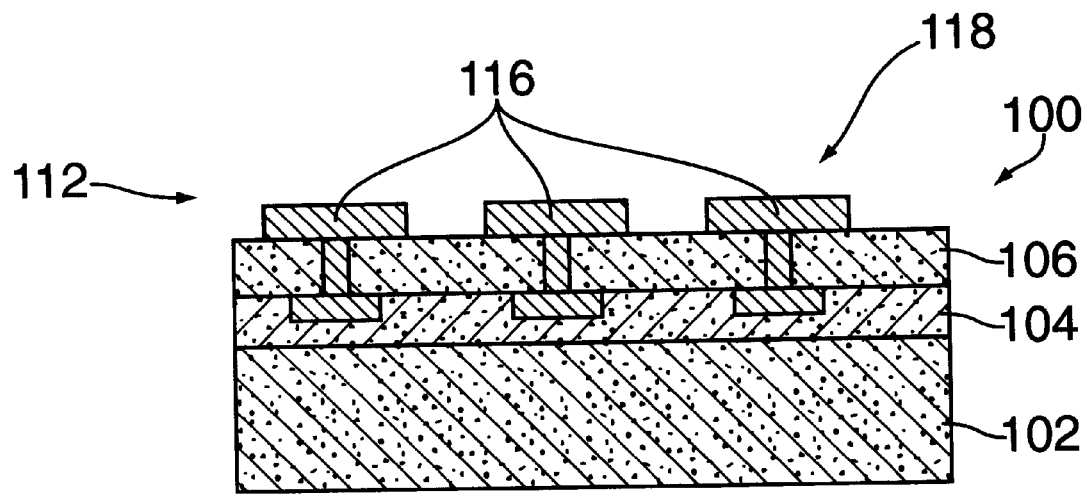
FIG. 4 is a cross-sectional view of the electroluminescent structure of FIG. 3 in accordance with the present invention showing pixel electrodes formed.

Referring to FIG. 4, conductive layer 112 is then patterned to form individual pixel electrodes 116. A resulting electrode array 118 provides a planar, highly reflective surface that maximizes the luminance to improve brightness in, for example, a display.

Figure 5:
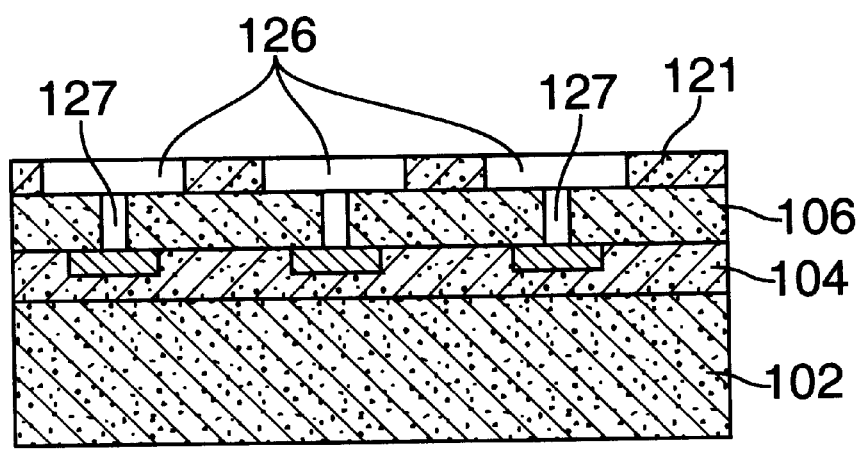
FIG. 5 is a cross-sectional view of an alternate embodiment of an electroluminescent structure in accordance with the present invention showing pockets formed for pixel electrodes.
Figure 6:
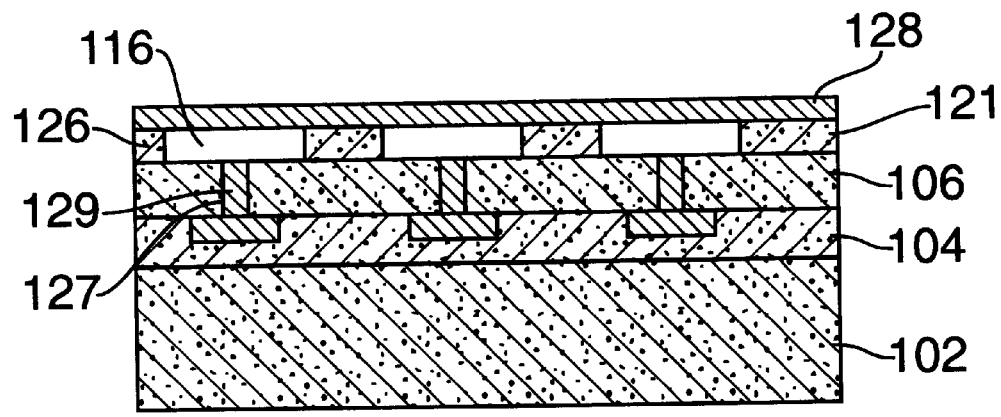
FIG. 6 is a cross-sectional view of the alternate embodiment of FIG. 5 in accordance with the present invention showing a conductive material deposited in the pockets.
Figure 7:
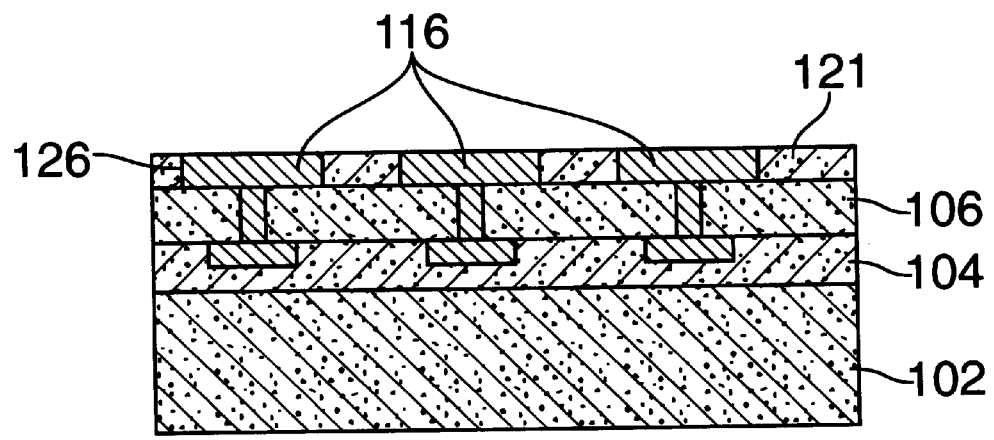
FIG. 7 is a cross-sectional view of the alternate embodiment of FIG. 6 in accordance with the present invention showing conductive material removed from the elevated dielectric surfaces to form pixel electrodes in the pockets.

Referring to FIGS. 5–7, in an alternate embodiment, pixel electrodes 116 (FIGS. 6 and 7) may be embedded in a lower dielectric constant layer 121 (lower dielectric constant than dielectric layer(s) that are used to isolate the EL layer) using a Damascene or equivalent process. Lower dielectric constant materials such as silicon dioxide or other materials compatible with phosphor stack definition are preferably used. In the Damascene or equivalent method, a photoresist mask is used to define the area of the individual pixel electrodes and protect the surrounding dielectric regions. Individual channels or pockets 126 are then etched in a planarized dielectric layer 121 with the dimensions of a desired pixel electrode. Holes 127 for vias are formed. A conductive layer 128 is then deposited over the dielectric surface including pockets 126 and polished back to remove extraneous material from the dielectric surface of layer 121 and leave conductive material, i.e., pixel electrodes 116 in pockets 126 and vias 129 formed in holes 127. The method produces a planar surface and, since the conductor is not directly patterned, enables the use of specialized conductors, i.e. highly reflective and low work function metals whose etchants may not be compatible with the conventional integrated circuit fabrication practices or with the underlying structures or substrate. Specialized conductor materials may include silver, aluminum, chromium, iridium, rhodium, or other suitable metals. As a result of the Damascene process, a planar surface results on electrodes 116 which is flush with surrounding dielectric layer 121 (FIG. 7).

Figure 1:
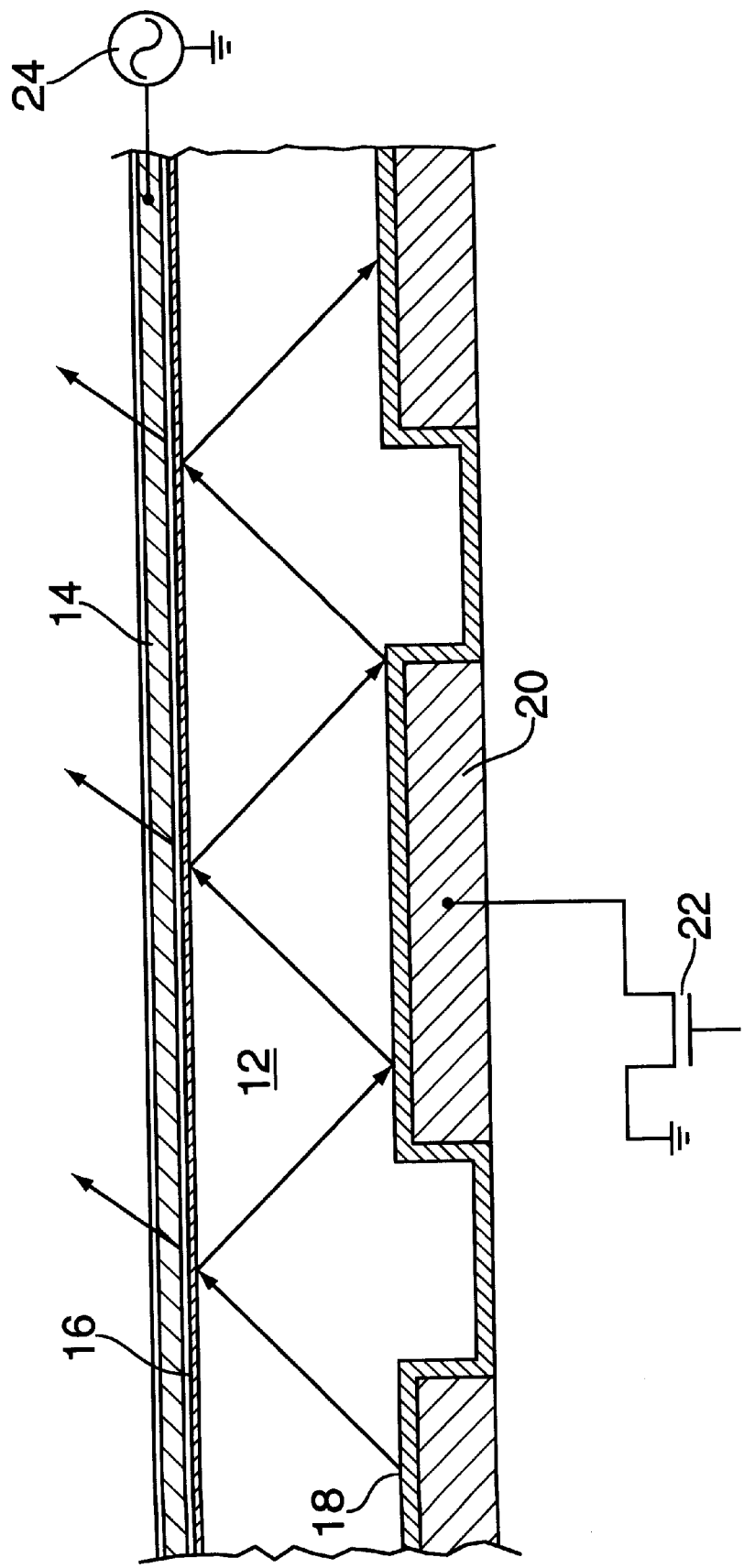
FIG. 1 is a cross-sectional view of a conventional electroluminescent device showing internal reflections.
Figure 8:
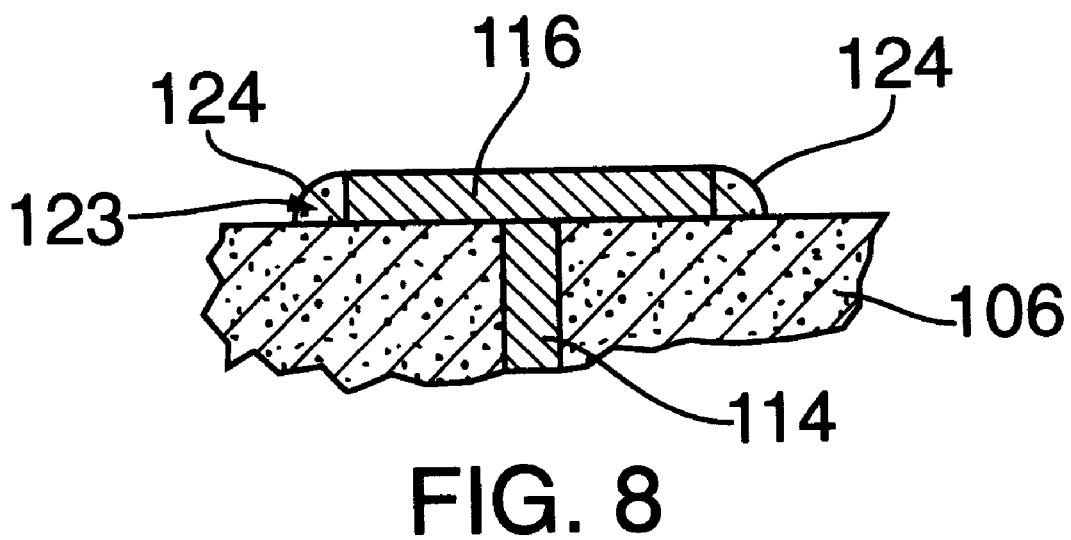
FIG. 8 is a cross-sectional view of another embodiment in accordance with the present invention showing dielectric material surrounding lateral surfaces of pixel electrodes.

Referring to FIG. 8, a relatively low dielectric constant material may be deposited over electrode array 118 (FIG. 4) to form a dielectric layer 123 to reduce the electric field around electrode edges or lateral surfaces, increase the proximate electroluminescent turn-on voltage and minimize or eliminate light emission from the edges. Low dielectric material is removed from electrode surfaces 122 by etching back using an anisotropic method to leave a residual ring 124 of material around electrodes 116, (ring 124 is self-aligned relative to the electrodes) or by etching through a conventional mask to prepare surfaces 122 to receive an EL phosphor stack. Dielectric materials for dielectric layer 123 may include materials that absorb at the phosphor (EL layer) radiation frequency and may be employed to control internal reflections as described with reference to FIG. 1.

Figure 9:
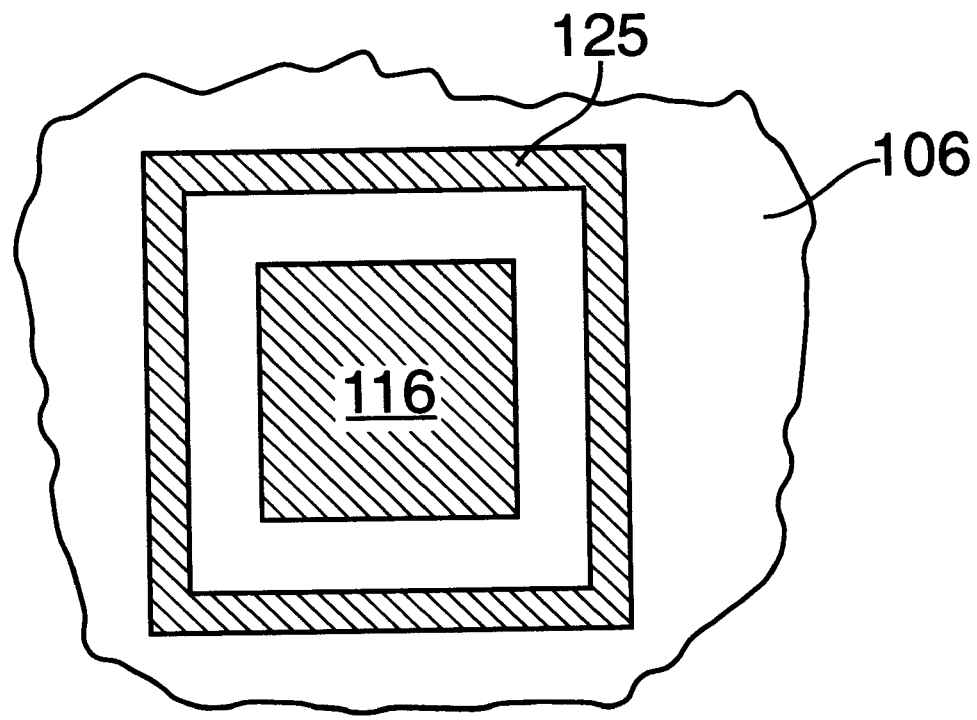
FIGS. 9–10 is a cross-sectional view of yet another embodiment in accordance with the present invention showing a ring of conductive material, electrically floating and spaced apart from and surrounding pixel electrodes.
Figure 10:
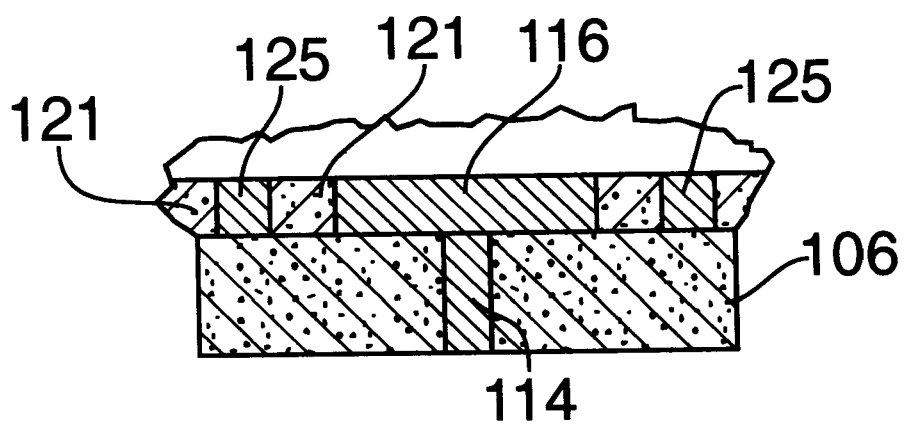

Referring to FIGS. 9 and 10, a ring 125 is spaced apart from electrodes 116 in another embodiment. A top view of a ring 125 is shown enclosing electrode 116 in FIG. 9. A cross-sectional view of the structure is shown in FIG. 10. Ring 125 includes a conductive material preferably the same material of electrodes 116. Ring 125 reduces lateral radiation from electrode 116 and reduces an electric field about electrode 116. Ring 125 electrically floats to prevent phosphor excitation between electrode 116 and ring 125. Electrodes 116 shown in previous embodiments may include ring 125 to further reduce internal reflections. Lower dielectric constant layer 121 may be included as shown.

Figure 11:
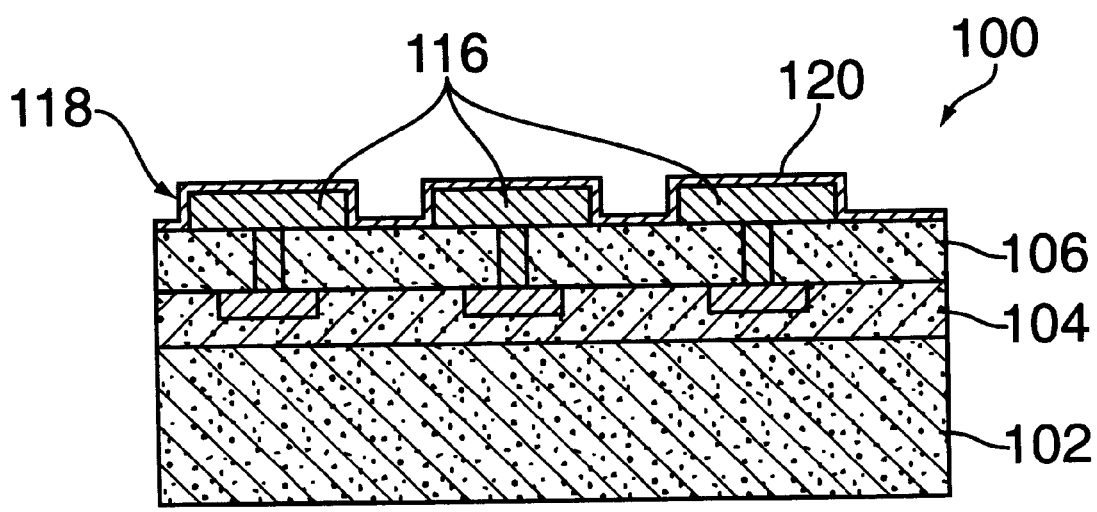
FIG. 11 is a cross-sectional view of structure of FIG. 4 in accordance with the present invention showing a dielectric layer deposited on the pixel electrodes.
Figure 12:
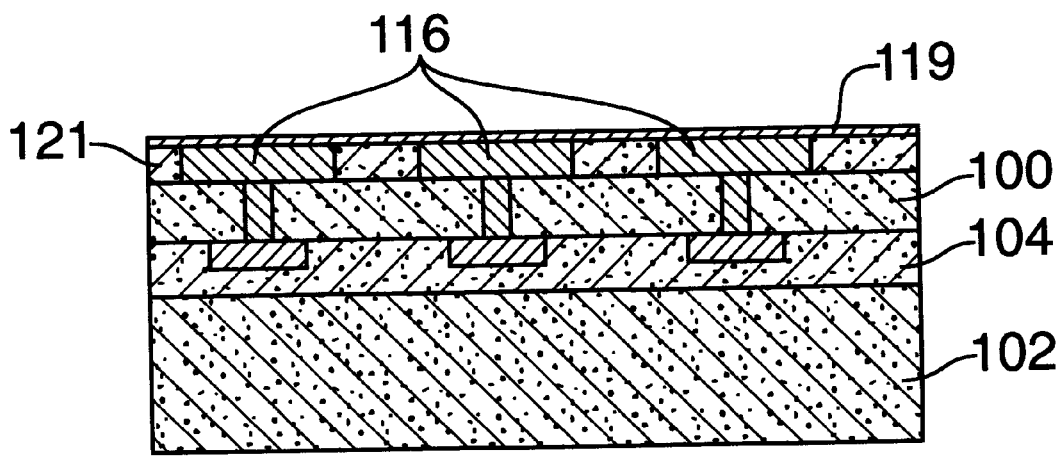
FIG. 12 is a cross-sectional view of structure of FIG. 7 in accordance with the present invention showing a dielectric layer deposited on the pixel electrodes and dielectric layer.

Referring to FIGS. 11 and 12, a dielectric material is deposited over the structures FIG. 4 or FIG. 7 to form a dielectric layer 120 or 119, respectively. FIG. 12 includes dielectric layer 119 disposed on electrodes 116 in accordance with the Damascene approach described above. FIGS. 11 and 12 include different structures that may include electrode structures as described with reference to FIGS. 8–10 above. For the structure of FIG. 12, dielectric layer 121 may function to reduce the electric field around electrode edges or lateral surfaces, increase the proximate electroluminescent turn-on voltage and minimize or eliminate light emission from the edges. Dielectric materials for dielectric layer 121 may include materials that absorb at the phosphor radiation frequency and may be employed to control internal reflections as described with reference to FIG. 1. Dielectric layer 120 of FIG. 11, is conformally formed over electrodes 116. Dielectric layer 119 of FIG. 12 may provide a reliability advantage over the structure of FIG. 11 since dielectric is deposited uniformly across the surface of the structure. Further, since dielectric layer 121 of FIG. 12 is disposed between electrodes, an EL layer 134 as described below is excluded from between electrodes thereby reducing emission of light between electrodes.

Figure 13:
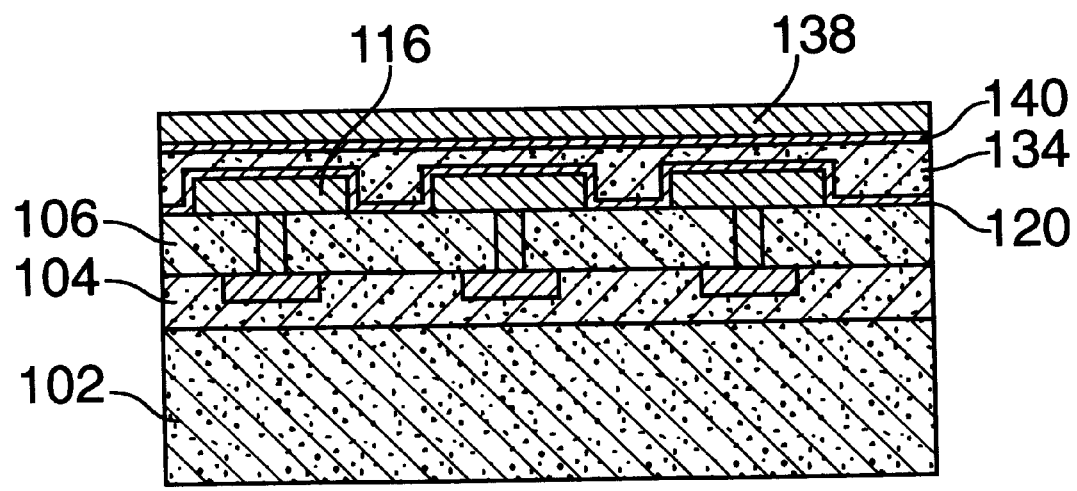
FIG. 13 is a cross-sectional view of the structure of FIG. 11 in accordance with the present invention showing an electroluminescent layer, another dielectric layer and a transparent electrode thereon.
Figure 14:
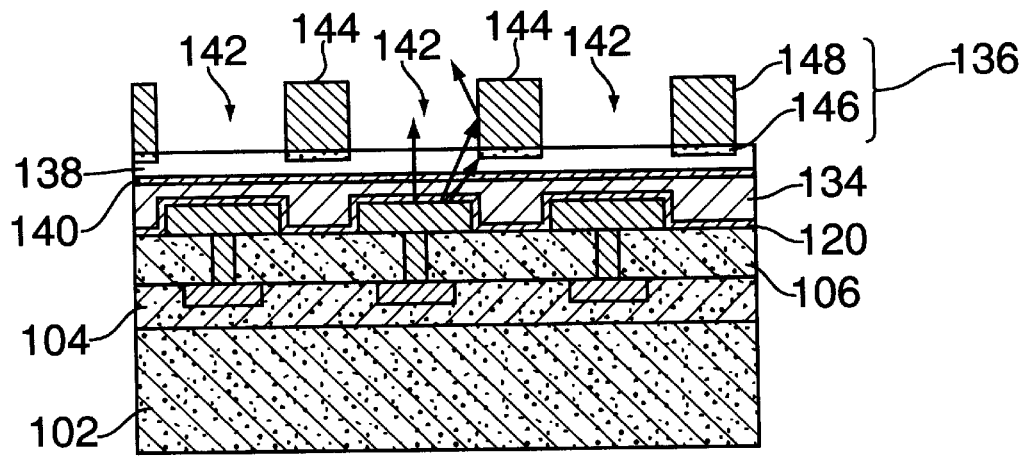
FIG. 14 is a cross-sectional view of the structure of FIG. 13 showing a grid in accordance with the present invention disposed on the transparent electrode.
Figure 15:
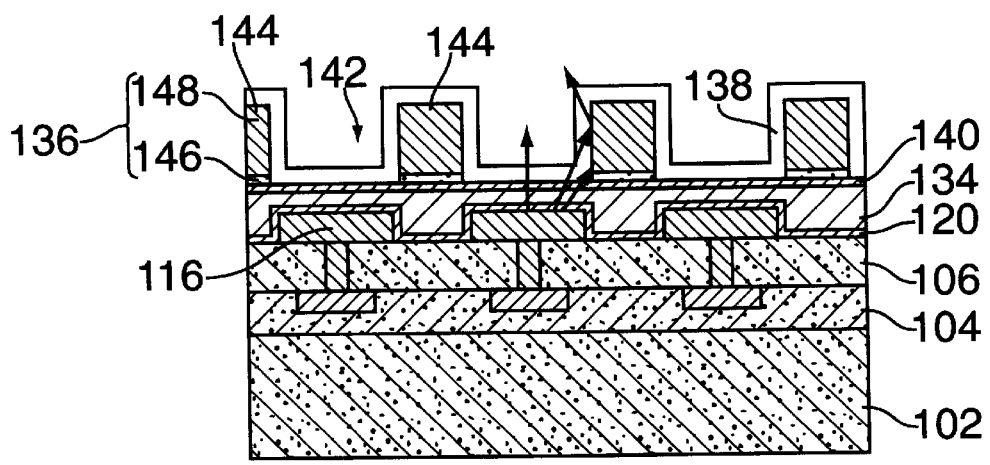
FIG. 15 is a cross-sectional view of the structure of FIG. 13 showing a grid in accordance with the present invention disposed below the transparent electrode.

Referring to FIGS. 13, 14 and 15, an electroluminescent (EL) layer 134 is deposited over electrodes 116. EL layer and adjacent dielectric layers 120 and 140 may be referred to as an EL stack. EL layer 134 may include zinc sulfide, strontium sulfide or organic materials. Processing is shown for the structure of FIG. 11, however the process is similarly applied to the structure of FIG. 12. A dielectric layer 140 is deposited on EL layer 134. A moderating grid or pattern 136 is introduced, either above (FIG. 14) or below (FIG. 15) a transparent electrode 138, to restrict the illumination direction from EL layer 134 and prevent light from internally reflecting and combining with reflected light from adjacent pixels. Grid 136 includes openings 142 over electrodes 116. Grid 136 functions to guide light from EL layer 134 without combining light from adjacent pixels. Guides 144 are fashioned from low reflectivity conductors, dielectric materials or other materials such as silicon. Guides 144 preferably include composite layers having an anti-reflective layer 146 on adjacent EL layer 134 and a reflective layer 148 on a viewer side. Guides 144 are employed to enhance the collimating effect and further define light from a given pixel source as shown by the arrows in FIGS. 14 and 15. The use of low resistivity materials over transparent electrode 138 offers an additional advantage of shunting the relatively high resistivity transparent electrode 138 and replacing long interconnections that tie electrodes to bonding pads. Guides 144 may be sized according to pixel pitch and/or electrode size. In one embodiment guides are about 1 micron high and about 1–3 microns wide.

Figure 16:
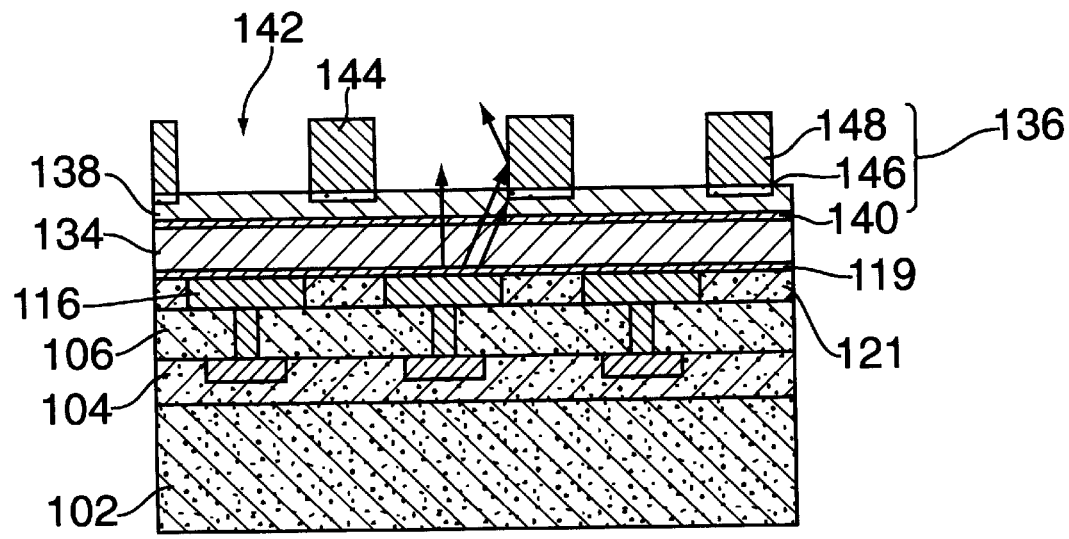
FIG. 16 is a cross-sectional view of the structure of FIG. 12 showing a grid in accordance with the present invention disposed on the transparent electrode.
Figure 17:
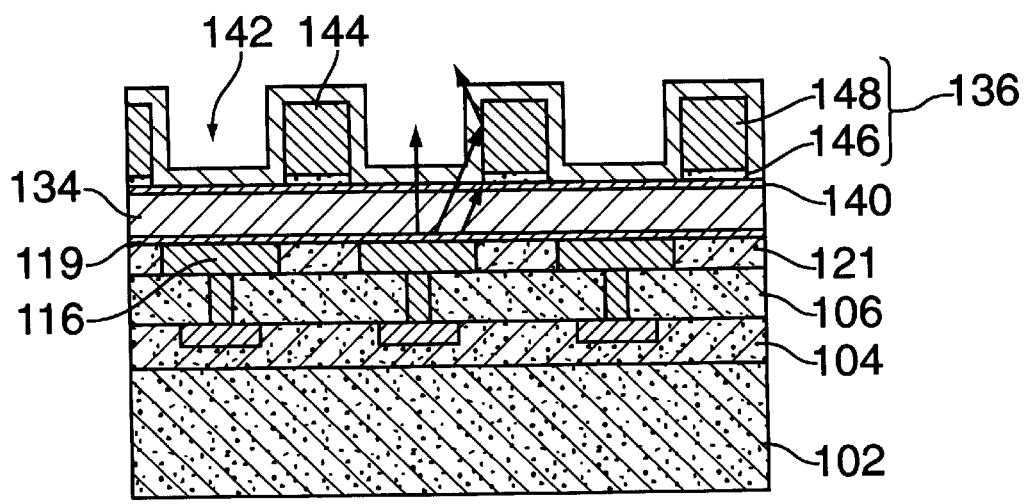
FIG. 17 is a cross-sectional view of the structure of FIG. 12 showing a grid in accordance with the present invention disposed below the transparent electrode.

Referring to FIGS. 16 and 17, EL layer 134 is deposited over electrodes 116. EL layer 134 may include zinc sulfide, strontium sulfide or organic materials. Processing is shown for the structure of FIG. 12. Dielectric layer 140 is deposited on EL layer 134. Moderating grid 136 is introduced, either above (FIG. 16) or below (FIG. 17) transparent electrode 138, to restrict the illumination direction from EL layer 134 and prevent light from internally reflecting and combining with reflected light from adjacent pixels. Grid 136 includes openings 142 over electrodes 116. Grid 136 functions to guide light from EL layer 134 without combining light from adjacent pixels. Guides 144 are fashioned from low reflectivity conductors, dielectric materials or other materials such as silicon. Guides 144 preferably include composite layers having an anti-reflective layer 146 on adjacent EL layer 134 and a reflective layer 148 on a viewer side. Guides 144 are employed to enhance the collimating effect and further define light from a given pixel source as shown by the arrows in FIGS. 16 and 17. The use of low resistivity materials over transparent electrode 138 offers an additional advantage of shunting the relatively high resistivity transparent electrode 138 and replacing long interconnections that tie electrodes to bonding pads. Guides 144 may be sized according to pixel pitch and/or electrode size. In one embodiment guides are about 1 micron high and about 1–3 microns wide.

Figure 18:
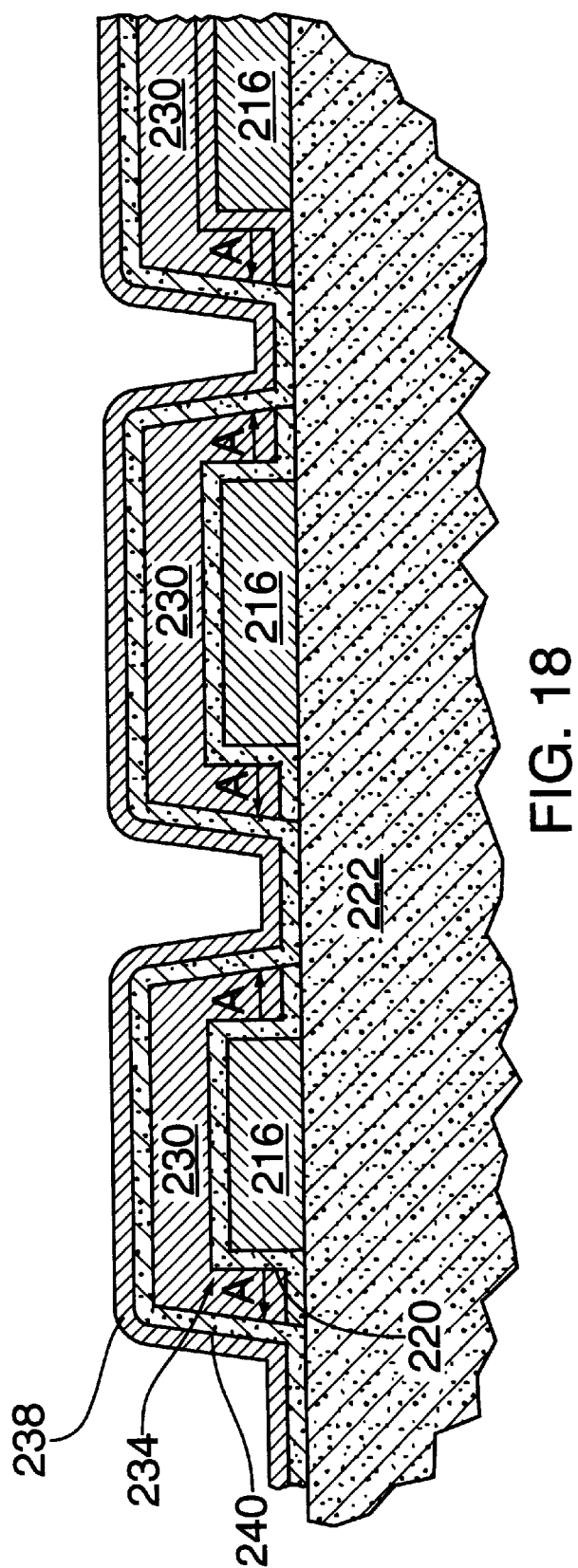
FIG. 18 is a cross-sectional view of another embodiment in accordance with the present invention having portions of electroluminescent layer separated and isolated therebetween by a second dielectric layer and a transparent electrode.

Referring to FIG. 18, in an alternate embodiment, lateral light diffusion (shown by arrows "A") from pixel electrodes 216 can also be controlled by masking and etching an EL layer 234 from between pixel electrodes 216 down to a dielectric layer 220 or an interlevel dielectric layer 222 and then depositing a dielectric layer 240 and a transparent electrode 238 to isolate EL regions 230 for individual pixel electrodes 216.

Further enhancement of the transmitted component and reduction of the internally reflected lateral component is accomplished by optimizing the composition and thickness of the individual layers in the EL stack. In one embodiment, dielectric layers are between about 1000 A and about 3000 A in thickness, and transparent electrode is between about 2000 A and about 4000 A in thickness. Materials may include aluminum oxide for the dielectric layers, and transparent electrodes preferably include indium-tin-oxide.

Further enhancements include combining compatible embodiments for example the structure described with reference to FIG. 18 may include a grid as described herein. As described, pixel electrodes for the various embodiments may include low dielectric constant rings to reduce light emission around lateral sides of the pixel electrodes and further include the grid as described.

Figure 19:
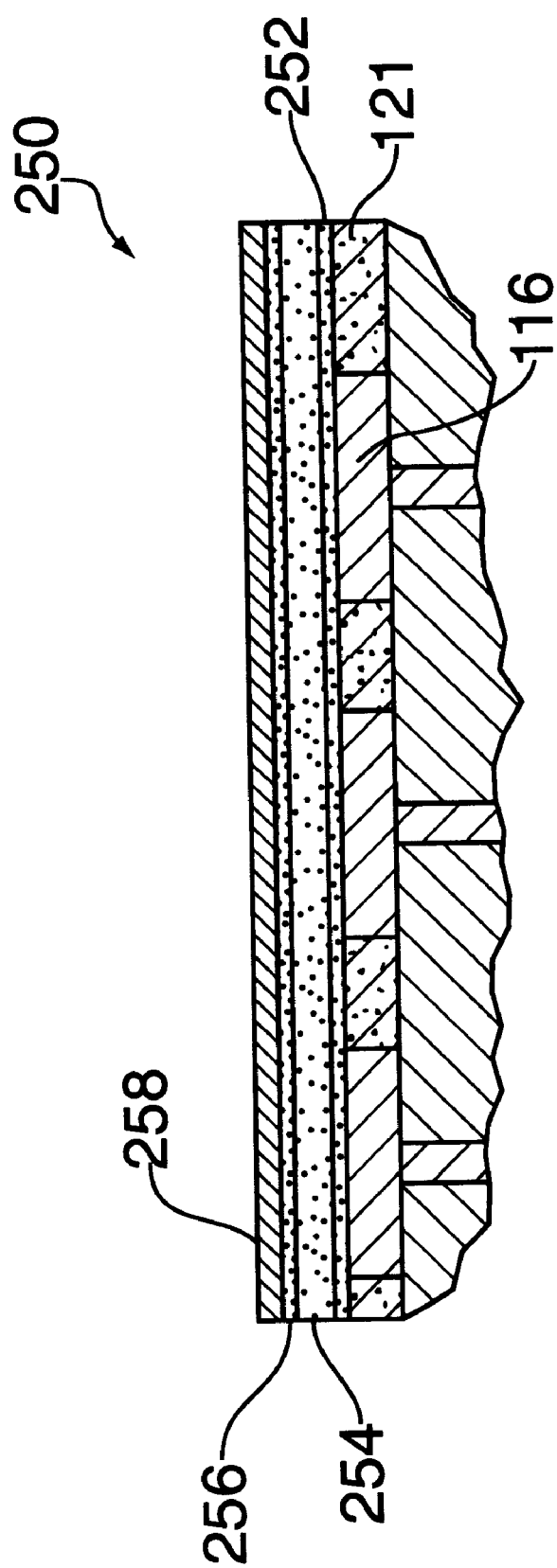
FIG. 19 is a cross-sectional view of another embodiment of the present invention showing an EL structure using organic materials in accordance with the present invention.

Referring to FIG. 19, an organic EL structure 250 includes electrodes 116 that may include one or more of the previously described electrode improvements of the present invention. In a preferred embodiment, electrode 116 is surrounded by a lower dielectric constant material 121. An electron transport layer 252 includes organic material, for example Alq (aluminum tris 8-hydroxyquinoline) without fluorescent molecules. An emitting layer 254 includes Alq (aluminum tris 8-hydroxyquinoline) doped with fluorescent molecules. A hole transport layer 256 includes for example, TPD (N,N'-diphenyl-N,N'-bis (3-methyl phenyl)-1,1'-biphenyl-4,4'-diamine). A transparent electrode 258 preferably includes indium-tin-oxide. Organic structure allows dc current flow through emitting layer 254 to provide EL radiation therefrom. The materials indicated are for illustrative purposes and may include other suitable materials or variations.

All of the above-described embodiments of the EL structure preferably include a passivation layer on the transparent electrode. The passivation layer is preferably silicon dioxide. A glass plate is placed and secured using a sealing ring to protect the structure from moisture and damage.

Figure 20:
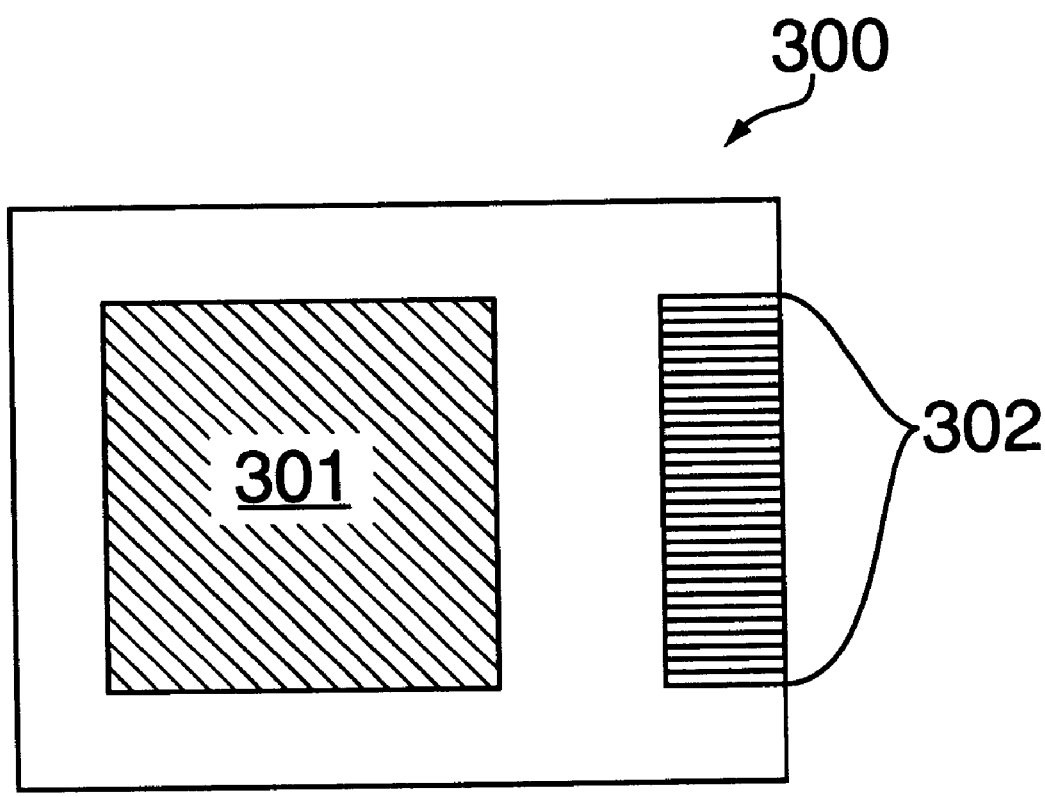
FIG. 20 is a top view of an electroluminescent display in accordance with the present invention.

Referring to FIG. 20, a display 300 is shown including any of the above-described structures (indicated by 301) in accordance with the present invention. Display 300 includes a plurality of pixels each having a corresponding electrode as described above. Display 300 includes bonding pads for electrically connecting display 300 to a controller and a power source (both not shown) through connector interface 302. Bonding pads are normally located on the outer perimeter of structure 301 and connect to wires or metal lines which electrically couple structure 301 to interface 302. Display 300 receives data signals to be displayed from a controller, and is powered by a power source (not shown). Display 300 may be used as a wearable monitor in for example, a head mounted display.

Having described preferred embodiments of improved electroluminescent devices and method of forming same (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. An electroluminescent device comprising:
    a plurality of pixel electrodes disposed on a dielectric layer and coupled to control circuit;
    an electroluminescent stack including an electroluminescent layer;
    a transparent electrode wherein the electroluminescent stack is disposed between the transparent electrode and the plurality of pixel electrodes; and
    a grid contiguous to the electroluminescent layer and having a plurality of openings over the plurality of pixel electrodes, the openings guiding light from the electroluminescent stack when the pixel electrodes are activated by the control circuitry and reducing internal reflections of light within the electroluminescent stack.

2. The electroluminescent device as recited in claim 1, wherein the grid includes a reflective material on a surface to reflect light in a desired direction.

3. The electroluminescent device as recited in claim 2, wherein the reflective material includes aluminum.

4. The electroluminescent device as recited in claim 2, wherein the reflective material includes chromium.

5. An electroluminescent device comprising:
    a plurality of pixel electrodes disposed on a dielectric layer and coupled to control circuitry;
    an electroluminescent stack;
    a transparent electrode wherein the electroluminescent stack is disposed between the transparent electrode and the plurality of pixels; and
    a grid forming a plurality of guides disposed between each of the pixel electrodes for guiding light from the electroluminescent stack when the pixel electrodes are activated by the control circuitry and reducing internal reflections of light within the electroluminescent stack, the guides including a reflective material on surfaces of the guide to reflect light in a desired direction and to reduce absorption of the electroluminescent light and an antireflection material on lower surfaces of the guide to reduce the internal reflections in the electroluminescent stack due to the guides.

6. The electroluminescent device as recited in claim 5, wherein the antireflection material includes titanium.

7. The electroluminescent device as recited in claim 5, wherein the antireflection material includes silicon.

8. The electroluminescent device as recited in claim 1, wherein the electroluminescent stack includes a first dielectric layer disposed between the pixel electrodes and the electroluminescent layer and a second dielectric layer disposed between the transparent electrode and the electroluminescent layer.

9. The electroluminescent device as recited in claim 8, wherein the electroluminescent layer includes separated portions, each portion being associated with an electrode of the pixel electrodes, the separated portions being isolated therebetween by the second dielectric layer and the transparent electrode to reduce lateral light diffusion between the separated portions.

10. The electroluminescent device as recited in claim 8, wherein the electroluminescent layer includes zinc sulfide.

11. The electroluminescent device as recited in claim 1, further comprises a dielectric material between pixel electrodes wherein the dielectric material absorbs light directed between the pixel electrodes.

12. The electroluminescent device as recited in claim 1, wherein the grid is disposed on the transparent electrode.

13. The electroluminescent device as recited in claim 1, wherein the grid is disposed beneath the transparent electrode and between the electroluminescent stack and the transparent electrode.

14. An electroluminescent device comprising:
    a plurality of pixel electrodes disposed on a dielectric layer and coupled to control circuitry;
    an electroluminescent stack;
    a transparent electrode wherein the electroluminescent stack is disposed between the transparent electrode and the plurality of pixel electrodes; and
    a plurality of guides disposed between each of the pixel electrodes for guiding light from the electroluminescent stack when the pixel electrodes are activated by the control circuitry and reducing internal reflections within the electroluminescent stack; and wherein the pixel electrodes include an electrically floating conductive ring spaced apart from and laterally surrounding each pixel electrode for reducing light emissions and electric field about the pixel electrodes.

15. An electroluminescent device comprising:

a substrate having an integrated control circuit formed thereon;

an interlevel dielectric layer disposed on the substrate;

a plurality of pixel electrodes disposed on the interlevel dielectric layer and coupled to the control circuit by vias formed in the interlevel dielectric layer;

an electroluminescent stack including an electroluminescent layer;

a transparent electrode wherein the electroluminescent stack is disposed between the transparent electrode and the pixel electrodes; and dielectric material forming a ring between and surrounding the pixel electrodes to raise the local effective excitation voltage of any luminescent material between the pixel electrodes to a voltage above that of the luminescent material on top of the pixel electrodes, said dielectric material having a same thickness as the pixel electrodes the dielectric material reduces an electric field and light emission from.

16. The electroluminescent device as recited in claim 15, further comprising a grid contiguous to the electroluminescent layer and having a plurality of openings over the plurality of pixel electrodes for guiding light from the electroluminescent stack when the pixel electrodes are activated by the control circuit and reducing internal reflections of light within the electroluminescent stack to provide improved brightness and resolution.

17. The electroluminescent device as recited in claim 16, wherein the grid includes a reflective material on a surface of the grid to reflect light in a desired direction.

18. The electroluminescent device as recited in claim 17, wherein the reflective material includes aluminum.

19. The electroluminescent device as recited in claim 17, wherein the reflective material includes chromium.

20. An electroluminescent device comprising:

a substrate having an integrated control circuit formed thereon;

an interlevel dielectric layer disposed on the substrate;

a plurality of pixel electrodes disposed on the interlevel dielectric layer and coupled to the control circuit by vias formed in the interlevel layer;

an electroluminescent stack;

a transparent electrode wherein the electroluminescent stack is disposed between the transparent electrode and the pixel electrodes;

a dielectric layer disposed between pixel electrodes and having a same thickness as the pixel electrodes wherein the dielectric layer reduces an electric field and light emission between pixel electrodes;

a plurality of guides disposed between the pixel electrodes for guiding light from the electroluminescent stack when the pixel electrodes are activated by the control circuit and reducing internal reflections of light within the electroluminescent stack to provide improved brightness and resolution, the guides including a reflective material on surfaces of the guide to reflect light in a desired direction and to reduce adsorption of the electroluminescent light, and wherein the guides include an antireflection material on lower surfaces of the guide to reduce internal reflections in the electroluminescent stack due to the guides.

21. The electroluminescent device as recited in claim 20, wherein the antireflection material includes titanium.

22. The electroluminescent device as recited in claim 20, wherein the antireflection material includes silicon.

23. The electroluminescent device as recited in claim 20, wherein the electroluminescent stack includes a first dielectric layer disposed between the pixel electrodes and an electroluminescent layer and a second dielectric layer disposed between the transparent electrode and the electroluminescent layer.

24. The electroluminescent device as recited in claim 23, wherein the dielectric layer between the pixel electrodes has a lower dielectric constant than the first and second dielectric layers of the electroluminescent stack.

25. The electroluminescent device as recited in claim 23, wherein the electroluminescent layer includes separated portions, each portion being associated with an electrode of the pixel electrodes, the separated portions being isolated therebetween by the second dielectric layer and the transparent electrode to reduce lateral light diffusion between the separated portions.

26. The electroluminescent device as recited in claim 23, wherein the electroluminescent layer includes zinc sulfide.

27. An electroluminescent device comprising:

a substrate having an integrated control circuit formed thereon;

an interlevel dielectric layer disposed on the substrate;

a plurality of pixel electrodes disposed on the interlevel dielectric layer and coupled to the control circuit by vias formed in the interlevel dielectric level;

an electroluminescent stack;

a transparent electrode wherein the electroluminescent stack is disposed between the transparent electrode and the pixel electrodes; and a dielectric layer disposed between the pixel electrodes and having a same thickness as the pixel electrodes wherein the dielectric layer reduces an electric field and light emission from between pixel electrodes, and wherein the pixel electrodes include an electrically floating conductive ring spaced apart from and laterally surrounding each pixel electrode for reducing light emissions and an electric field about the pixel electrodes.

28. A method for fabricating an electroluminescent device comprising the steps of:

providing a substrate having an integrated control circuit formed therein;

forming an interlevel dielectric layer on the substrate;

forming a plurality of pixel electrodes on the interlevel dielectric layer, the pixel electrodes being coupled to the control circuit;

forming an electroluminescent stack on the pixel electrodes, said stack including an electroluminescent layer;

forming a transparent electrode over the electroluminescent stack; and forming a grid contiguous to the electroluminescent layer and having a plurality of openings over the plurality of pixel electrodes for guiding light from the electroluminescent stack when the pixel electrodes are activated by the control circuit and reducing internal reflections of light within the electroluminescent stack.

29. The method in accordance with claim 28 wherein the grid is disposed on the transparent electrode.

30. The method in accordance with claim 28 wherein the grid is disposed beneath the transparent electrode and between the electroluminescent stack and the transparent electrode.

31. A method for fabricating an electroluminescent device comprising the steps of:

provinding a substrate having an integrated control circuit formed therein and an interlevel dielectric layer formed on the substrate;

depositing a first dielectric layer on the interval dielectric layer;

forming pockets in the first dielectric layer;

forming pixel electrodes in the pockets and electrically coupling the pixel electrodes to the control circuit, the first dielectric layer having a same thickness as the pixel electrodes;

forming an electroluminescent stack on the pixel electrodes; and forming a transparent electrode over the electroluminescent stack; and wherein the step of forming pixel electrodes includes the step of providing a conductive material about lateral surfaces of the pixel electrodes, the conductive material being spaced apart from and electrically floating relative to the pixel electrodes, the conductive material for absorbing electroluminescent light produced by the electroluminescent layer and for reducing an electric field between pixel electrodes.

* * * * *